US010153455B2

(12) United States Patent
Tamekawa et al.

(10) Patent No.: US 10,153,455 B2
(45) Date of Patent: Dec. 11, 2018

(54) DISPLAY DEVICE AND METHOD OF MANUFACTURING A DISPLAY DEVICE

(71) Applicant: Japan Display Inc., Tokyo (JP)

(72) Inventors: Mitsugu Tamekawa, Tokyo (JP); Shiro Sumita, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/440,478

(22) Filed: Feb. 23, 2017

(65) Prior Publication Data
US 2017/0279071 A1    Sep. 28, 2017

(30) Foreign Application Priority Data

Mar. 28, 2016 (JP) ................................. 2016-062958

(51) Int. Cl.
*H01L 51/52* (2006.01)
*H01L 27/32* (2006.01)
*H01L 51/56* (2006.01)

(52) U.S. Cl.
CPC ...... *H01L 51/5237* (2013.01); *H01L 27/3244* (2013.01); *H01L 27/3258* (2013.01); *H01L 51/5203* (2013.01); *H01L 51/524* (2013.01); *H01L 51/5246* (2013.01); *H01L 51/56* (2013.01); *H01L 2227/323* (2013.01); *H01L 2251/566* (2013.01)

(58) Field of Classification Search
CPC .............. H01L 51/5237; H01L 51/524; H01L 51/5246; H01L 2227/323; H01L 27/3276; H01L 27/6288
See application file for complete search history.

(56) References Cited

U.S. PATENT DOCUMENTS

| 2004/0137142 A1 | 7/2004 | Nishikawa | |
| 2015/0263314 A1* | 9/2015 | Sakuishi | H01L 51/0097 438/28 |
| 2016/0141549 A1* | 5/2016 | Odaka | H01L 51/5246 257/40 |

FOREIGN PATENT DOCUMENTS

| JP | 2004-165068 A | 6/2004 |
| JP | 2007-234312 A | 9/2007 |
| JP | 2007-234318 A | 9/2007 |

* cited by examiner

*Primary Examiner* — David Spalla
(74) *Attorney, Agent, or Firm* — Typha IP LLC

(57) ABSTRACT

A manufacturing method of a display device in an embodiment according to the present invention, the method includes forming a terminal electrode in a terminal part of a first substrate, forming a pixel electrode corresponding to each pixel in a pixel part of the first substrate, forming a first intermediate layer in a region including the terminal electrode of the terminal part, forming an organic layer above the pixel electrode in the pixel part, forming a counter electrode layer above the first substrate including the pixel part and the terminal part, forming a passivation layer above the counter electrode layer, arranging a second substrate opposing the pixel part and bonding the first substrate and the second substrate using a sealing member enclosing the pixel part, and removing the first intermediate layer, the counter electrode layer and the passivation layer in the terminal part.

9 Claims, 11 Drawing Sheets

US 10,153,455 B2

DISPLAY DEVICE AND METHOD OF MANUFACTURING A DISPLAY DEVICE

CROSS REFERENCE TO RELATED APPLICATIONS

This application is based upon and claims the benefit of priority from the prior Japanese Patent Application No. 2016-062958, filed on Mar. 28, 2016, the entire contents of which are incorporated herein by reference.

FIELD

One embodiment of the present invention is related to a display device including a terminal part and a pixel part and a method of manufacturing the display device.

BACKGROUND

A liquid crystal display device utilizing the electro-optical effects of liquid crystals or an organic electroluminescence display device using an organic electroluminescence element are being developed as display devices to be used in electric appliances or electronic devices. These display devices are formed with a display screen using a plurality of pixels arranged above a substrate. A liquid crystal element or an organic electroluminescence element is arranged as a display element in each pixel of the display device. The display device displays video or still images by driving a pixel part arranged with such pixels using a pixel circuit and driving circuit formed by a transistor. The display device includes a terminal part which is applied with a video signal, a timing signal for controlling the operation of a circuit, and power and the like.

The display device is stacked with an insulation film, semiconductor film and conductive film, and by forming these thin films into a certain shape, a wiring pattern for forming a transistor or a circuit is created. In this case, each terminal electrode in the terminal part is required to be exposed to the exterior of the display device. As a result, in order to make the terminal part, different processing is required for a transistor or display element arranged in a pixel part. Specifically, a process for exposing the surface of each terminal electrode in the terminal part to an exterior surface is required.

For example, in the manufacturing process of a display device in Japanese Laid Open Patent Publication No. 2004-165068, a method is disclosed in which an organic insulation layer which functions as a laser removal layer is arranged above a terminal part, and after forming a passivation film covering the entire surface of a substrate, laser light is irradiated onto the organic insulation layer of the terminal part covered with the passivation film to generate ablation in the organic insulation layer and expose a terminal electrode in a terminal region.

However, since processing control in a depth direction is difficult in a method for exposing a terminal electrode by irradiating laser light, when attempting to securely expose a terminal electrode, the surface of the terminal electrode becomes damaged by the laser light. On the other hand, processing is complex in a method for exposing a terminal electrode by etching and there are problems of a drop in yield and an increase in manufacturing costs. For example, in a terminal part of a display device, since a plurality of cover films with different materials are deposited in a manufacturing process, an etching method for each layer is required or it is necessary to change an etching liquid or etching gas, and further manufacturing equipment for exposing a terminal electrode is required.

SUMMARY

A manufacturing method of a display device in an embodiment according to the present invention, the method includes forming a terminal electrode in a terminal part of a first substrate, forming a pixel electrode corresponding to each pixel in a pixel part of the first substrate, forming a first intermediate layer in a region including the terminal electrode of the terminal part, forming an organic layer above the pixel electrode in the pixel part, forming a counter electrode layer above the first substrate including the pixel part and the terminal part, forming a passivation layer above the counter electrode layer, arranging a second substrate opposing the pixel part and bonding the first substrate and the second substrate using a sealing member enclosing the pixel part, and removing the first intermediate layer, the counter electrode layer and the passivation layer in the terminal part.

A display device in an embodiment according to the present invention includes a pixel part arranged with a plurality of pixels, and a terminal part arranged with a plurality of terminal electrodes. The terminal part includes a region in which the terminal electrode is exposed, and a region stacked with an insulation layer, a counter opposing electrode layer and a passivation layer extending from the pixel part to above the terminal electrode, and wherein the counter electrode layer and the passivation layer have a taper shaped end surface.

DESCRIPTION OF EMBODIMENTS

The embodiments of the present invention are explained below while referring to the diagrams. However, it is possible to perform the present invention using various different forms, and the present invention should not be limited to the content described in the embodiments exemplified herein. Although the width, thickness and shape of each component are shown schematically compared to their actual form in order to better clarify explanation, the drawings are merely an example and should not limit an interpretation of the present invention. In the specification and each drawing, the same reference symbols are attached to similar elements and elements that have been mentioned in previous drawings, and therefore a detailed explanation may be omitted where appropriate. Notations such as "a" and "b" attached to the end of a symbol are sometimes used to identify the same element. Furthermore, the characters "first" and "second" attached to each element are convenient labels used for distinguishing each element and do not contain any further meaning unless otherwise explained.

In the present specification, in the case where certain parts or regions are given as "above (or below)" other parts or regions, as long as there is no particular limitation, these include parts which are not only directly above (or directly below) other parts or regions but also in an upper direction (or lower direction). That is, in the case where certain parts or regions are given as "above (or below)" other parts or regions, other structural elements may be included between other parts or regions in an upper direction (or lower direction). In the following description, unless otherwise specified, the side on which the second substrate is disposed with respect to the first substrate is referred to as "upper" or "upper direction", and the opposite side is referred to as "lower" or Will be described as "lower direction".

A first substrate explained in the present specification includes at least one planar shaped main surface and each of an insulation layer, semiconductor layer and conductive layer or each of a transistor and display element are arranged above this main surface. In the following explanation, in the case where "above", "upper layer", "upwards" or "upper surface" are explained with respect to a first substrate using a main surface of the first substrate as a reference in a cross-sectional view, unless otherwise noted, the main surface of the first substrate is described as a reference.

Figure 1:
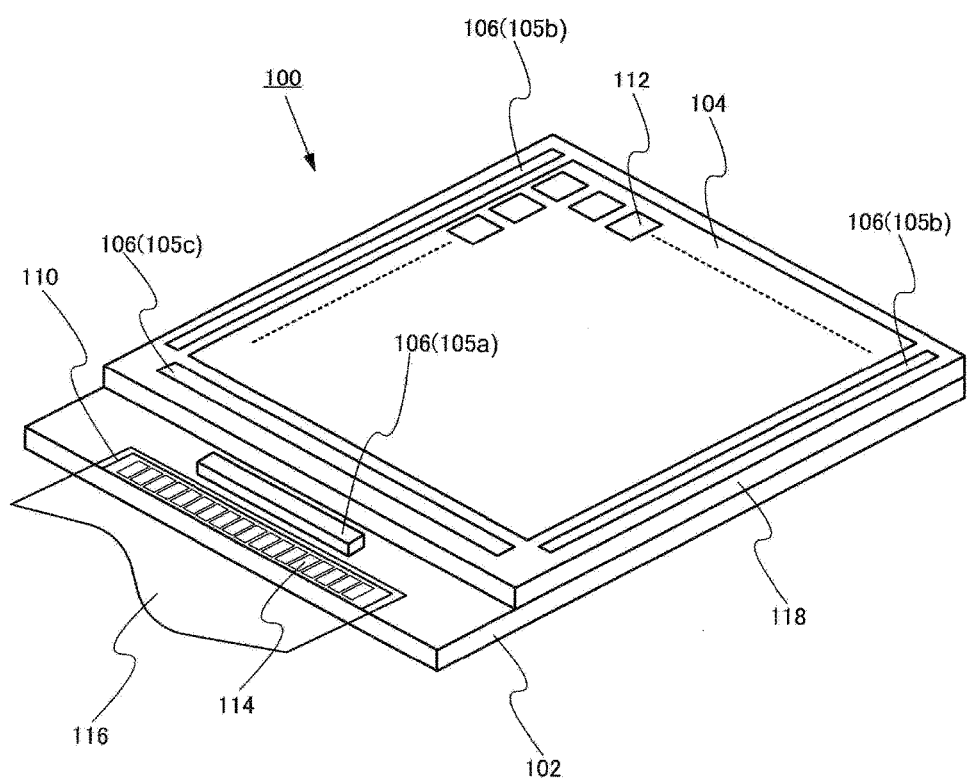
FIG. 1 is a perspective view diagram showing a structure of a display device related to one embodiment of the present invention.

FIG. 1 shows a perspective view of a display device 100 related to one embodiment of the present invention. The display device 100 includes a first substrate 102 and a sealing member 118. A pixel part 104, drive circuit part 106 (driver IC 105a, scanning line drive circuit 105b, switch circuit 105c) and a terminal part 110 are arranged in a first surface of the first substrate 102. The pixel part 104 is arranged with a plurality of pixels 112 in a row direction and column direction. The terminal part 110 is arranged with a plurality of terminals 114. The sealing member 118 is arranged so as to cover the pixel part 104 at a first surface side of the first substrate 102. The sealing member 118 is formed from a glass substrate or organic resin substrate the same as the first substrate 102. In addition, instead of a plate shaped member such as the first substrate, the sealing member 118 is formed by a stacked layer body with alternately stacked organic resin layers and inorganic layers. The terminal part 110 is arranged at an end part of the first substrate 102 and on the outer side of the sealing member 118. In addition, among the drive circuit parts 106, the drive IC 105a is arranged on the outer side of a sealing part.

A signal for operating each circuit (drive IC 105a, scanning line drive circuit 105b, switch circuit 105c) of the drive circuit part 106 is input via a terminal electrode 114 of the terminal part 110. The terminal electrode 114 has a conductive electrode surface which is exposed and is connected with a flexible printed circuit substrate 116 by an anisotropic conductive layer. The flexible printed circuit substrate 116 connects the display device 100 with other function circuits or external devices.

A glass substrate or organic resin substrate is used for the first substrate 102. For example, a polyimide substrate is used for the organic resin substrate. The thickness of the organic resin substrate can be set from a few micrometers to a few tens of micrometers and a sheet display having flexibility can be realized. The sealing member 118 is formed from a glass substrate or organic resin substrate the same as the first substrate 102. In addition, instead of a plate shaped member such as the first substrate, the sealing member 118 is formed by a stacked layer body with alternately stacked organic resin layers and inorganic layers.

Each region of the pixel part 104 and terminal part 110 arranged above the first substrate 102 is not separately prepared but prepared during the same process. For example, each region is prepared by processing the same conductive layer as a conductive layer for forming certain wiring included in the pixel part 104, or a conductive layer for forming at least a part of the terminal electrode 114 of the terminal part 110.

Figure 2:
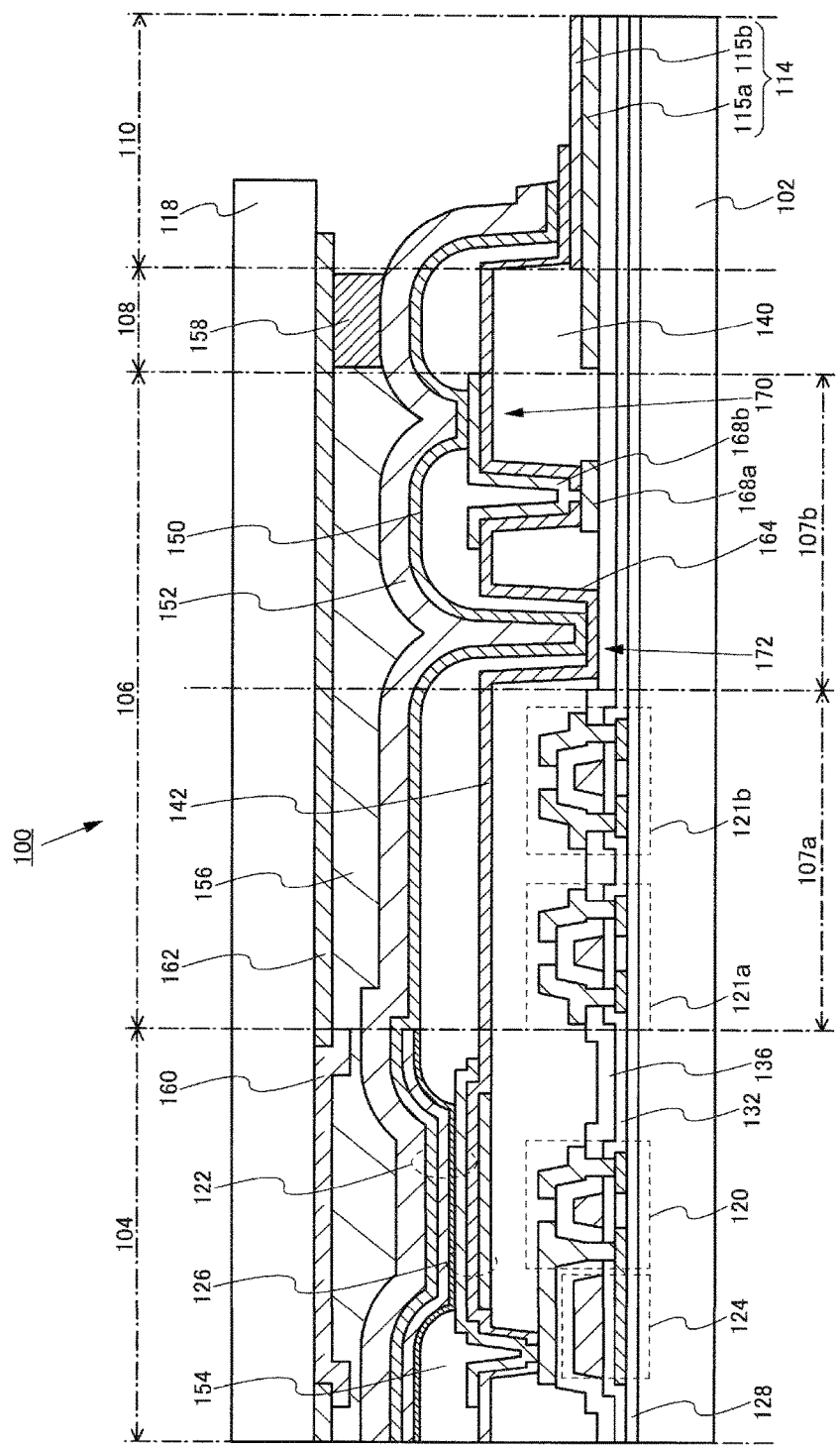
FIG. 2 is a cross-sectional diagram showing a structure of a display device related to one embodiment of the present invention.
Figure 3:
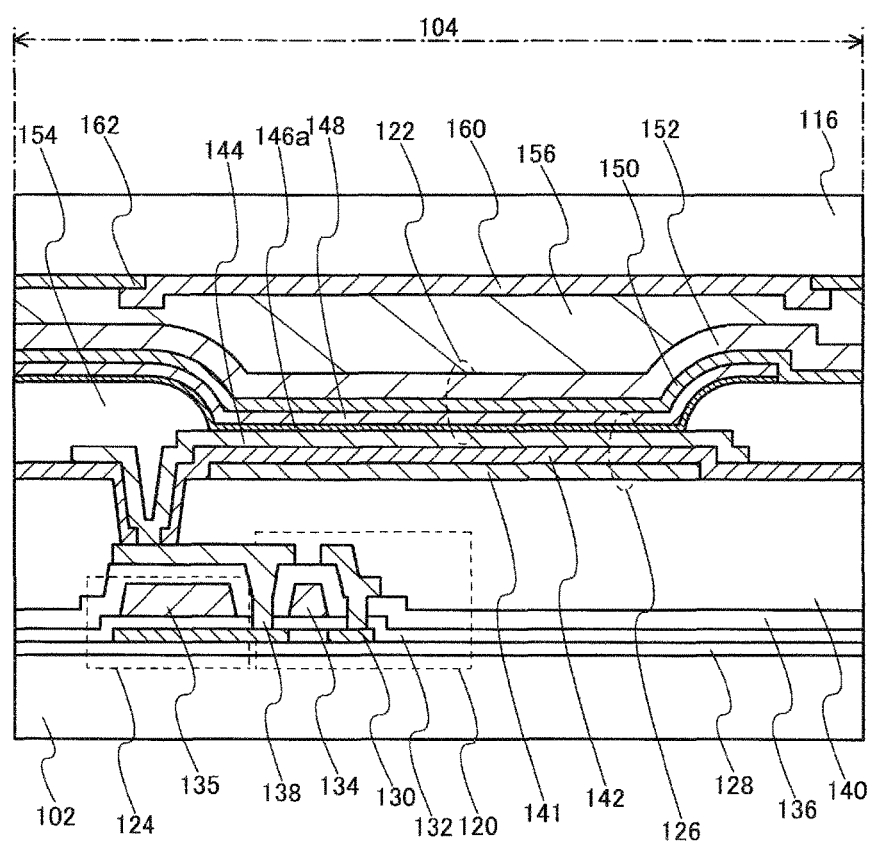
FIG. 3 is a cross-sectional diagram showing a structure of a pixel part of a display device related to one embodiment of the present invention.

FIG. 2 shows a cross-sectional structure of the display device 100. In addition, FIG. 3 shows a cross-sectional view for explaining the details of a pixel 112 in the pixel part 104. An explanation is given below by appropriately referencing FIG. 2 and FIG. 3.

As is shown in FIG. 2, the display device 100 includes the pixel part 104, drive circuit part 106, a sealing part 108 and terminal part 110. The drive circuit part 106 includes a circuit region 107a and wiring region 107b. The pixel part 104 is arranged with a transistor 120, light emitting element 122, first capacitor element 124 and second capacitor element 126 above the first substrate 102. Details of these elements are shown in FIG. 3.

As is shown in FIG. 3, the light emitting element 122 is electrically connected with the transistor 120. A current which flows between a source and drain of the transistor 120 is controlled by a video signal applied to a gate and light emitting luminosity of the light emitting element 122 is controlled by this current. The first capacitor element 124 stores a gate voltage of the transistor 120 and the second capacitor element 126 is arranged for adjusting the amount of current flowing to the light emitting element 122.

A base insulation layer 128 is arranged on the first surface of the first substrate 102. The transistor 120 is arranged above the base insulation layer 128. The transistor 120 has a structure in which a semiconductor layer 130, gate insulation layer 132 and gate electrode 134 are stacked. The semiconductor layer 130 is an amorphous or polycrystalline silicon or an oxide semiconductor and the like. A source/drain electrode 138 is arranged in an upper layer of the gate electrode 134 via the first insulation layer 136. A second insulation layer 140 is arranged as a leveling layer in an upper layer of the source/drain electrode 138. The first insulation layer 136 is formed by an inorganic insulation material such as silicon oxide or silicon nitride, and the second insulation layer 140 is formed from an organic insulation material such as polyimide or acrylic.

The light emitting element 122 is arranged in an upper surface of the second insulation layer 140. The light emitting element 122 has a structure in which a pixel electrode 144 electrically connected with the transistor 120, an intermediary layer 146, organic layer 148 and counter electrode layer 150 are stacked. The light emitting element 122 is a two-terminal element and emitted light is controlled by controlling a voltage between the pixel electrode 144 and the counter electrode layer 150. In addition, a bank layer 154 formed from an organic insulation material is arranged above the second insulation layer 140 in order to cover a periphery edge part and expose an inner side region of the pixel electrode 144. The counter electrode layer 150 is arranged in an upper surface of the organic layer 148 and is arranged from above the pixel electrode 144 to an upper surface part of the bank layer 154. Furthermore, the bank layer 154 covers a periphery edge part of the pixel electrode 144 and is formed from an organic resin material to form a gentle step at an end part of the pixel electrode 144. Acrylic or polyimide and the like are used for the organic resin material.

The organic layer 148 includes a light emitting material such as an organic electroluminescence material. The organic layer 148 is formed using a low molecular or high molecular organic material. In the case where a low molecular organic material is used, in addition to a light emitting layer including an organic material with light emitting properties, the organic layer may also be formed including a hole injection layer and electron injection layer sandwiching the light emitting layer, and may further include a hole transport layer and electron transport layer. For example, the organic layer 148 can be formed with a structure in which a light emitting layer is sandwiched by a hole injection layer and an electron injection layer. In addition, the organic layer 148 may be appropriately added with a hole transport layer, electron transport layer, hole block layer and electron block layer in addition to a hole injection layer and electron injection layer and the like. Although not shown in the diagram, a formation end of the organic layer may be designed to extend as far as the terminal part.

The intermediate layer 146 arranged between the pixel electrode 144 and organic layer 148 is formed from a material including carbon. For example, the intermediate layer 146 is formed from amorphous carbon. The intermediate layer 146 is arranged in order to increase carrier injection properties from the pixel electrode 144 to the organic layer 48. The thickness of the intermediate layer 146 is formed between 1 nm~10 nm, 3 nm for example.

Furthermore, in one embodiment of the present invention, the light emitting element 122 includes a top-emission type structure in which light emitted by the organic layer 148 is irradiated to the counter electrode layer 150 side. As a result, the pixel electrode 144 is preferred to have light reflecting properties. Apart from being formed by a metal material with light reflecting properties such as aluminum (Al) and silver (Ag), the pixel electrode 144 may include a structure in which a transparent conductive layer formed from ITO (Indium Tin Oxide) or IZO (Indium Zinc Oxide) which have excellent hole injection properties, and a metal layer with light reflecting properties are stacked.

Since light emitted by the organic layer 146 passes through the counter electrode layer 148, it is preferred to be formed by a transparent conductive film such as ITO or IZO having translucency and conductivity.

The first capacitor element 124 is formed in a region in which the semiconductor layer 130 and first capacitor electrode 135 overlap with the gate insulation layer 132 as a dielectric layer. In addition, the second capacitor element 126 is formed with the second capacitor electrode 141 arranged overlapping the pixel electrode 144, and a third insulation layer 142 arranged between the pixel electrode 144 and second capacitor electrode 141 as a dielectric layer.

The passivation layer 152 is arranged above the light emitting element 122. The passivation layer 152 is arranged to prevent water and the like from infiltrating the light emitting element 122. A material having translucency such as an inorganic insulation layer of silicon nitride or aluminum oxide and the like is preferred as the passivation layer 152. In addition, the passivation layer 152 may have a structure in which this inorganic insulation layer and an organic insulation layer are stacked.

A color filter layer 160 and light blocking layer 162 may be arranged in the sealing member 118. When white light is emitted from the light emitting element 122, it is possible to set light of a specific wavelength band as the light emitted from a pixel 112 by arranging the color filter layer 160. In addition, in the case where light emitted from the light emitting element 122 is light of a specific wavelength band (for example, blue color band, green color band, red color band), it is possible to increase color purity of light emitted from a pixel 122 by arranging a color filter layer 160 matching the emitted light.

In FIG. 2, a circuit region 107a of the drive circuit part 106 is formed with a scanning line drive circuit 105b and switch circuit 105c by transistors 121a, 121b. For example, the transistor 121a is an n-channel type transistor and the transistor 121b is a p-channel type transistor. In addition, the counter electrode layer 150 extends from the pixel part 104 to the wiring region 107b.

An opening part 164 which passes through the second insulation layer 140 is arranged in the wiring region 107b. The opening part 164 is arranged along at least one side of the pixel part 104. The second insulation layer 140 is separated into the pixel part 104 side and an end part side of the first substrate 102 by the opening part 164. In addition, the bank layer 154 is also similarly separated by the opening part 164. The third insulation layer 142 above the second insulation layer 140, and the counter electrode layer 150 arranged on an upper surface of the bank layer 154 are arranged along the opening part 164. That is, the third insulation layer 142 is arranged along a side surface (side surface of the second insulation layer 140) of the opening part 164 and a bottom surface (upper surface of the first insulation layer 136) of the opening part 164.

In this way, a sealing structure is formed by separating the second insulation layer 140 formed by an organic insulation material and the bank layer 154 using the opening part 164, and by arranging the third insulation layer 142 formed from an inorganic material and the counter electrode layer 150 so as to cover a side surface and bottom surface of the opening part 164. The third insulation layer 142 is arranged in close contact at a bottom part of the opening part 164. In this way, by sandwiching the second insulation layer 140 and bank layer 154 formed from an organic insulation material between layers of an inorganic material, it is possible to prevent water and the like from infiltrating to the pixel part 104 from the sealing part 108 side. That is, this structure prevents water from passing through the second insulation layer 140 and bank layer 154 formed from an organic insulation material and infiltrating a region in the pixel part 104. A region in which the opening part 164 which divides the second insulation layer 140 and bank layer 154 is arranged can function as a water blocking region 172 and this structure can be called a "water blocking structure".

A contact part 170 in which the counter electrode layer 150 is electrically connected with a lower layer wiring 168 may also be included in the drive circuit part 106. The counter electrode layer 150 is controlled to a certain voltage by being connected to the wiring 168. Furthermore, a contact hole 167 is arranged in the second insulation layer 140 in the case where a connection is formed by the wiring 168b arranged above the second insulation layer 140 and the wiring 168a arranged above the first insulation layer 136.

A sealing material 158 is arranged in the sealing part 108. The sealing material 158 adheres the first substrate 102 and sealing member 118 together. A region sandwiched by the first substrate 101 and sealing member 118 is blocked off from the air by the sealing material 158. The pixel part 104 is arranged in an enclosed space sandwiched by the first substrate 102, sealing member 118 and sealing material 158. Furthermore, a filler 156 may be arranged in a space part between the first substrate 102 and sealing member 118.

The terminal part 110 is arranged with a terminal electrode 114. The terminal electrode 114 includes a first terminal layer 115a and second terminal layer 115b. The first terminal layer 115a is arranged using the same layer as the conductive layer which forms the source/drain electrode 138 for example. The first terminal layer 115a may also have the same layer structure in the case where the source/drain electrode 138 has a stacked structure arranged with a titanium (Ti) layer on an upper layer side and lower layer side of aluminum (Al). In addition, the first terminal layer 115a may also be formed by the same conductive layer as the gate electrode 134. The second terminal layer 115b is formed using a conductive metal oxide film. For example, the second terminal layer 115b is formed using a transparent conductive film such as ITO or IZO. Since this type of second terminal layer 115b is hard compared to the first terminal layer 115a and has conductivity even when oxidized, it can be suitably arranged as a top surface layer of the terminal electrode 114.

Although the base insulation layer 128, gate insulation layer 132, first insulation layer 136, second insulation layer 140, third insulation layer 142, counter electrode layer 150 and passivation layer 152 are arranged on roughly the entire surface above the first substrate 102, a region is included in which the second insulation layer 140, third insulation layer 142, counter electrode layer 150 and passivation layer 152 arranged on an at least an upper layer side of the terminal electrode 114 is removed in the terminal part 110. The terminal electrode 114 is exposed to an outer surface by this removed region.

Conventionally, each of the second insulation layer 140, third insulation layer 142, counter electrode layer 150 and passivation layer 152 are processed by wet-etching or dry-etching to expose the upper surface of the terminal electrode 114. However, in one embodiment of the present invention, the terminal electrode 114 is exposed by an easier method without such an etching process. Details of this process are explained below according to the manufacturing process of the display device 100.

Figure 4:
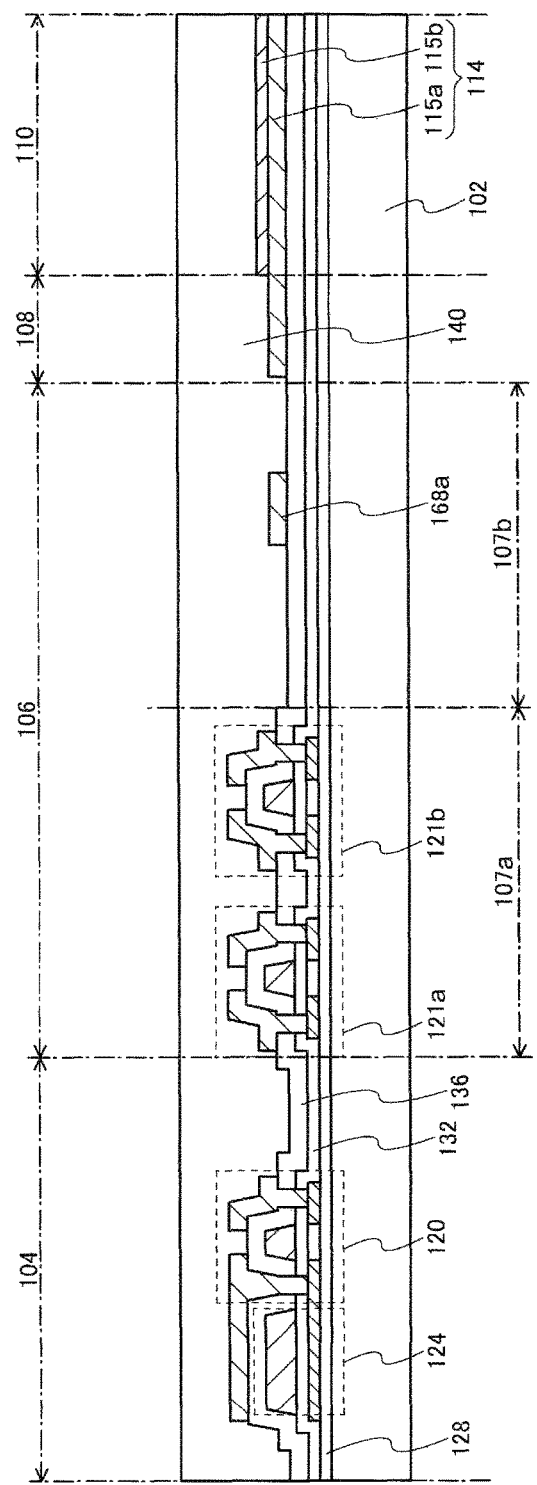
FIG. 4 is a cross-sectional diagram for explaining a manufacturing process of a display device related to one embodiment of the present invention.

FIG. 4 shows a stage at which the base insulation layer 128, transistor 120 of the pixel part 104 (formed including the semiconductor layer 130, gate insulation layer 132 and gate electrode 134), and first capacitor element 124 (formed using the first capacitor electrode 135, gate insulation layer 132, and source/drain electrode 138), transistors 121a, 121b of the drive circuit part 106, first terminal 115a of the terminal part 110, first insulation layer 136, source/drain electrode 138, and second insulation layer 140 are formed on a first surface of the first substrate 102. The transistor 120 of the pixel part 104 and the transistors 121a, 121b of the drive circuit part 106 have the same structure. In addition, the first terminal layer 115a of the terminal part 110 is formed using the same conductive layer as the source/drain electrode 138 above the first insulation layer 136. For example, the first terminal layer 115a has a structure in which three layers of a titanium (Ti) layer, aluminum (Al) layer and titanium (Ti) layer are stacked from a lower layer side.

As is shown in FIG. 4, the first insulation layer 136 is formed by a single layer or a plurality of layers. For example, the first insulation layer 136 is formed by stacking a silicon nitride film and silicon oxide film. This type of first insulation layer 136 is manufactured by a plasma CVD method or sputtering method. The second insulation layer 140 formed above the first insulation layer 136 is formed from an organic insulation material. It is preferred that a high molecular material such as polyester, polyamide, polyimide and polysiloxane be included as the organic insulation material. The second insulation layer 140 is formed on roughly the entire surface of the first substrate 102 using a spincoat method, an inkjet method, a laminate method, a printing method, a dip coating method or vapor deposition polymerization method using the organic insulation material. The second insulation layer 140 is preferred to be formed at a thickness of 1 micrometer or more. In this way, it is possible to bury irregularities due to the transistor 120 by the second insulation layer 140 to form a flat surface above the first substrate 102.

Figure 5:
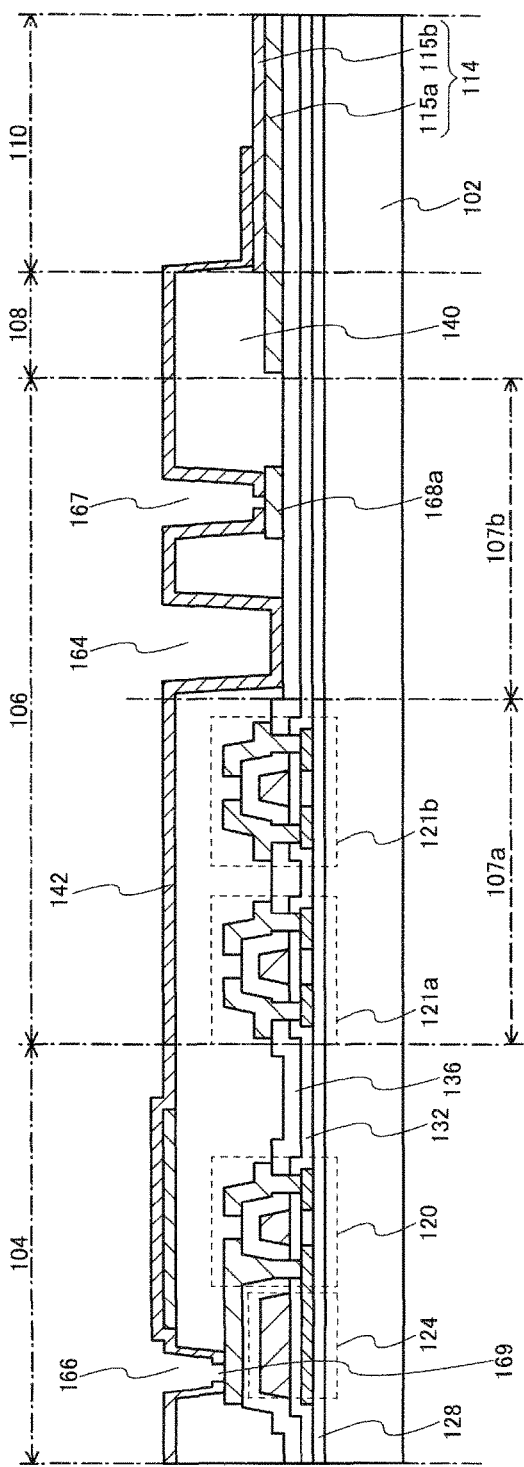
FIG. 5 is a cross-sectional diagram for explaining a manufacturing process of a display device related to one embodiment of the present invention.

FIG. 5 shows a stage at which the second capacitor electrode 141 is formed above the second insulation layer 140 in the pixel part 104, and a contact hole 166 passing through the second insulation layer 140 reaching the source/drain electrode 138 and the opening part 164 are arranged. Furthermore, a contact hole 167 is formed in the second insulation layer 140 in the case where wiring 168a is arranged above the first insulation layer 136. A part of the second insulation layer 140 covering the upper surface of the first terminal layer 115a in the terminal part 110 is also removed at the same time as the contact hole 166 is formed. Furthermore, a photolithography process is performed after film formation of the second insulation layer 140 in the case where the second insulation layer 140 is formed from a photosensitive organic insulation material, and formation of the contact hole 166 and formation of a removal pattern of the terminal part 110 are performed by development and sintering.

The third insulation layer 142 is manufactured by a silicon nitride film or silicon oxide film. The third insulation layer 142 is manufactured on roughly the entire surface of the first substrate 102 by a plasma CVD method or sputtering method without using a shadow mask when forming a film. When the third insulation layer 142 is formed after formation of a contact hole, the bottom surface of the contact hole 166 becomes covered by the third insulation layer 142. In this case, it is preferred that an opening part 169 is arranged overlapping the contact hole 166 also in the third insulation layer 142. It is possible to remove the third insulation layer 142 formed on the upper surface of the first terminal layer 115a at the same time as forming the opening part 169.

Furthermore, it is preferred that the second terminal layer 115b is formed above the first terminal layer 115a at this stage. The second terminal layer 115b may be formed in the same conductive layer as the second capacitor electrode 141 or formed in the same conductive layer as other wiring or electrodes formed in the pixel part 104 or drive circuit part 106. The second terminal layer 115b is preferred to be formed by a transparent conductive film such as ITO or IZO.

Figure 11:
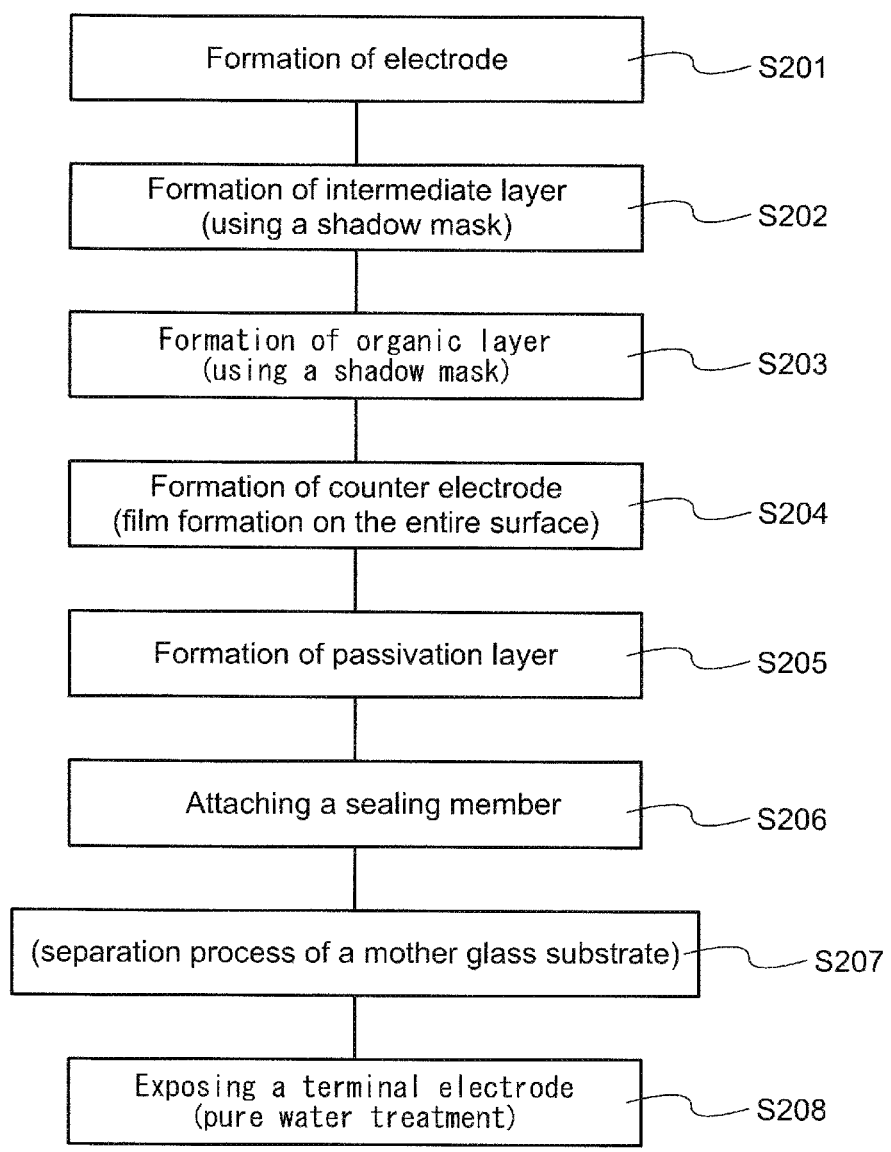
FIG. 11 is a flowchart for explaining a manufacturing process of a display device related to one embodiment of the present invention.

A circuit including a transistor is formed in the pixel part 104 and drive circuit part 106 and the terminal electrode 114 is formed in the terminal part 110 above the first substrate 102 by the stages up to those described above. In the following process, the pixel electrode 144 is formed (S201), an intermediate layer is formed (S202), an organic layer is formed (S203), a counter electrode layer is formed (S204), a passivation layer is formed (S205), a sealing member is attached (S206), and a process for exposing a terminal electrode is performed (S208) as is shown in FIG. 11. When a plurality of display panels is taken from a mother glass substrate (large area substrate), a separation process of a mother glass substrate (S207) is performed between steps S206 and S207.

Figure 6:
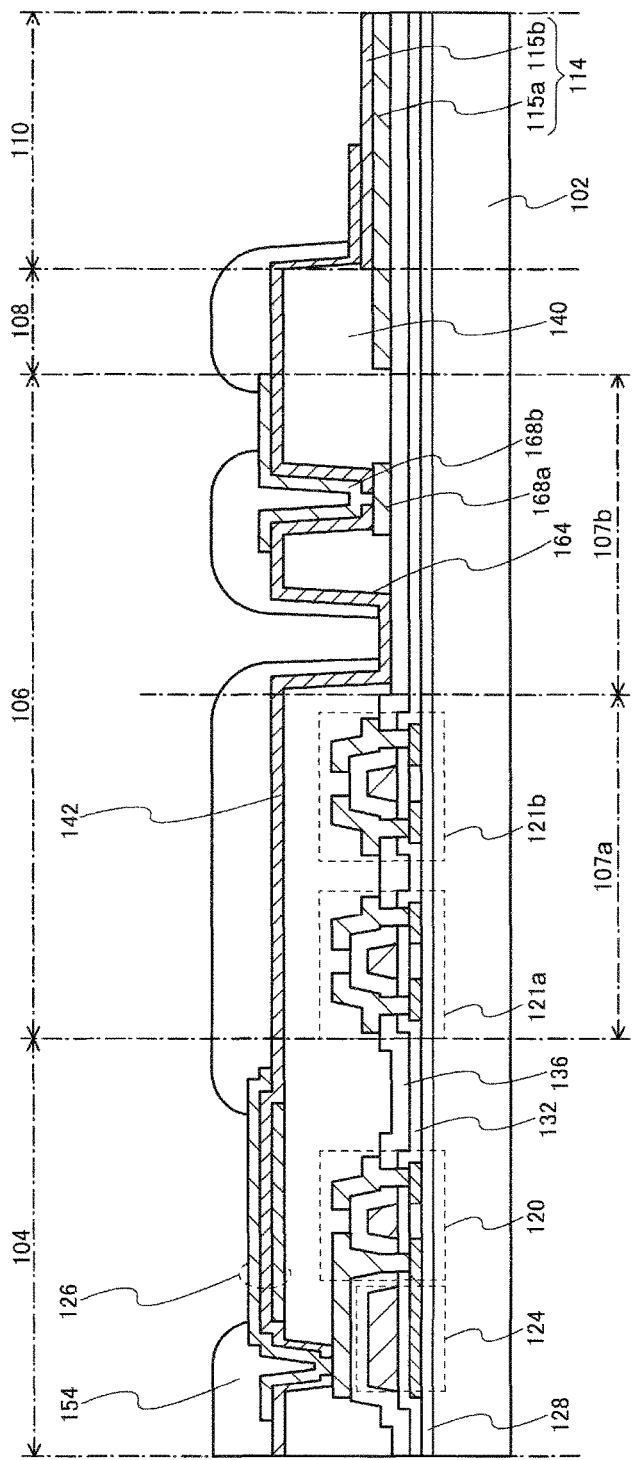
FIG. 6 is a cross-sectional diagram for explaining a manufacturing process of a display device related to one embodiment of the present invention.

FIG. 6 shows a stage (S201) where the pixel electrode 144 is formed. The pixel electrode 144 is formed using ITO or IZO as a transparent conductive film in the case where light emitted from the light emitting element 122 is emitted to the first substrate 102 side. In addition, in the case where light emitted from the light emitting element 122 is emitted to the counter electrode layer 150 side as in the present embodiment, a metal such as aluminum (Al) or silver (Ag) or an alloy of these is used. Alternatively, the pixel electrode 144 is formed by stacked layers of these metal layers and a conductive metal oxide layer. For example, the pixel electrode 144 is manufactured from a stacked layer structure (for example, ITO/Ag/ITO) in which a metal layer is sandwiched by conductive metal oxide layers. In addition, the second capacitor element 126 is formed by the pixel electrode 144, the second capacitor electrode 141 and the third insulation layer 142 sandwiched therebetween.

At this stage, wiring 168b connected with wiring 168a is formed in the contact hole 167 formed in the second insulation layer 140 in order to form the contact hole 170 of the counter electrode layer 150 in the drive circuit part 106. The wiring 168b can be formed using the same conductive layer as the pixel electrode 144.

After forming the pixel electrode 144, the bank layer 154 is formed using an organic insulation material. The bank layer 154 buries a step caused by the contact holes 166, 167 formed in an end part of the pixel electrode 144 and the second insulation layer 140. Furthermore, this type of bank layer 154 is sometimes called a separation wall or rib. The bank layer 154 can be formed using a material usable for the second insulation layer 140 such as acrylic resin or polyimide resin. The bank layer 154 is formed with an opening part so as to expose the pixel electrode 144, a bottom part of the opening part 164 and an upper surface of the wiring 168b. An end part of the opening part of the bank layer 154 is preferred to have a smooth taper shape. When the end part of the opening part of the bank layer 154 has a steep gradient, the covering properties of the subsequently formed organic layer 148 and the like become poor which easily leads to defects. In addition, the bank layer 154 is formed so as to not be arranged on an upper surface of the terminal electrode 114 in the terminal part 110. That is, as described previously, the bank layer 154 is formed so that the upper surface part of the terminal electrode 114 is also open when forming an opening part of the bank layer 154.

Figure 7:
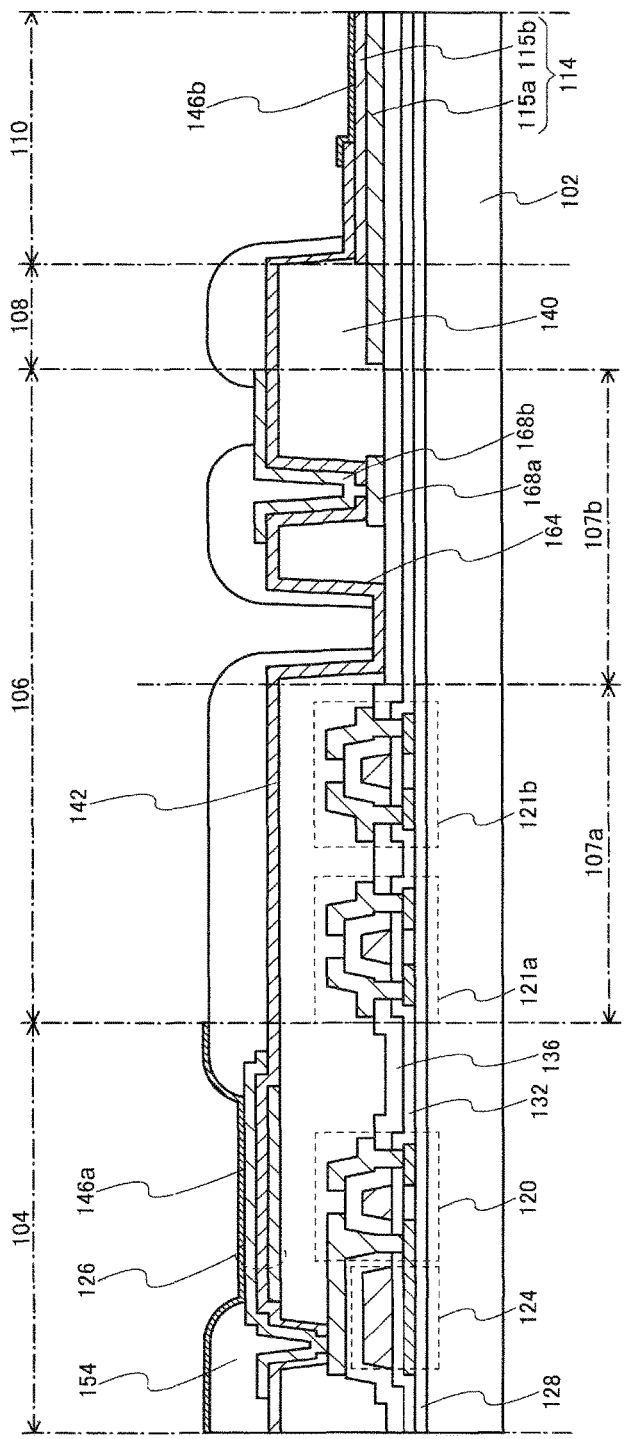
FIG. 7 is a cross-sectional diagram for explaining a manufacturing process of a display device related to one embodiment of the present invention.

FIG. 7 shows a stage (S202) where an intermediate layer is formed. The intermediate layer 146 is formed using an amorphous carbon film for example. This type of intermediate layer 146 is manufactured so that a cover film is formed in a certain region using a shadow mask (thin plate having an opening part) on a film formation surface (first surface) of the first substrate 102. Specifically, an intermediate layer 146a is formed above the pixel electrode 144 of the pixel part 104 and above the bank layer 154. In addition, at the same time, an intermediate layer 146b is also formed above the terminal electrode 144. The intermediate layer 146b is formed above the second terminal layer 115b. The intermediate layer 146 is formed by a sputtering method. At this time, it is possible to simultaneously manufacture the intermediate layer 146a of the pixel part 104 and the intermediate layer 146b of the terminal part 110 by arranging a shadow mask on a first surface side of the first substrate 102 and performing film formation. The thickness of the intermediate layer 146 is 1 nm to 10 nm as described above and is formed to a film thickness of 3 nm for example.

Figure 8:
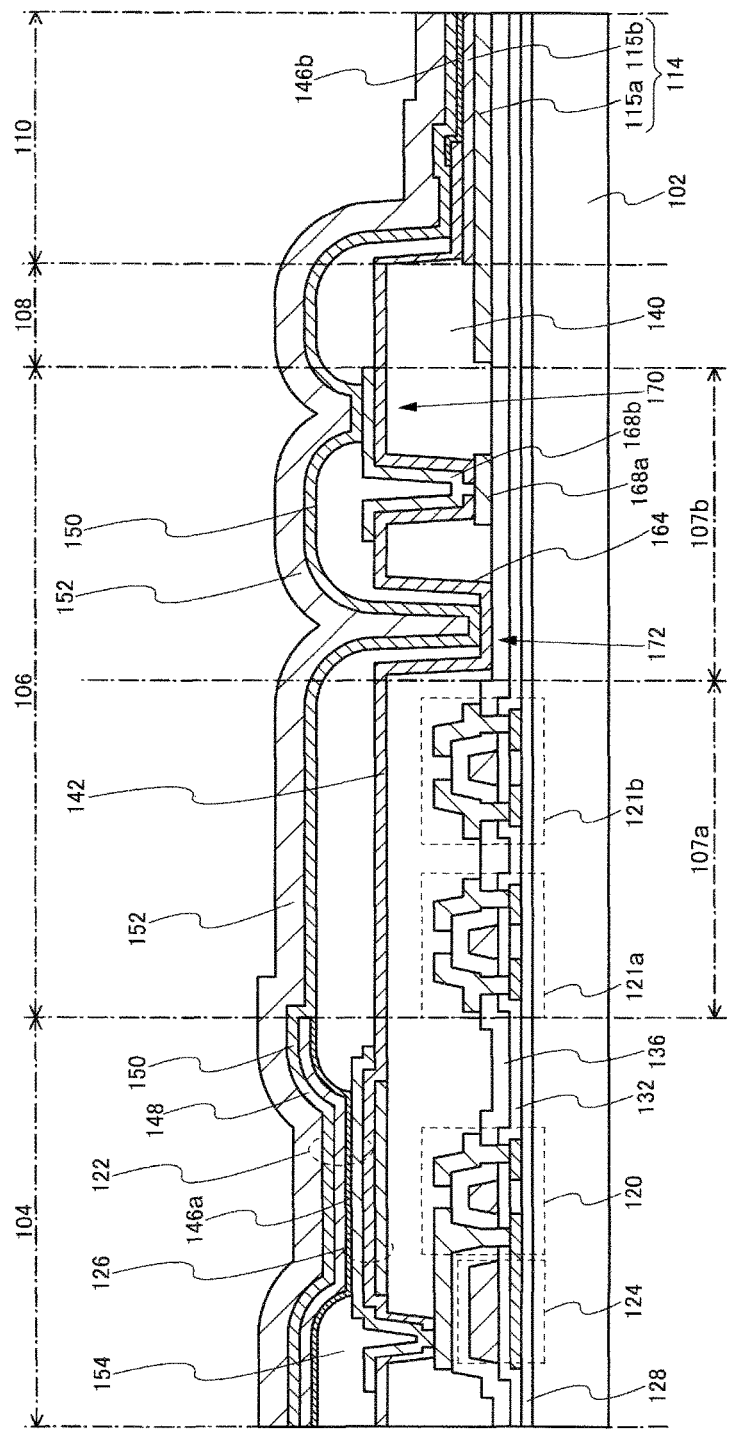
FIG. 8 is a cross-sectional diagram for explaining a manufacturing process of a display device related to one embodiment of the present invention.

FIG. 8 shows a stage where the organic layer 148, counter electrode layer 150 and passivation layer 152 are formed. Formation of the organic layer 148 is performed after formation of the intermediate layer 146 (S203). The organic layer 148 is formed so as to overlap the intermediate layer 146a at least above the pixel electrode 144. For example, the organic layer 148 is formed using the same shadow mask as when forming the intermediate layer 146 by a vacuum deposition method. The organic layer 148 includes an organic electroluminescence material and is formed by a single layer or plurality of layers. For example, the organic layer 148 is formed by appropriately combining a carrier injection layer, a carrier transport layer, a light emitting layer, a carrier blocking layer and an exciton blocking layer. Furthermore, the organic layer 148 has a different material to that included in an adjacent pixel and light emitting layer, and may be formed so that other layers such as a carrier transport layer have the same structure. In this way, it is possible to obtain emitted light of different colors between pairs of adjacent pixels and full color display is possible. In this case, the color filter layer 162 and light blocking layer 164 shown in FIG. 8 become unnecessary (not shown in the diagram). Reversely, the same organic layer 148 may be used in all the pixels. In this case, the organic layer 148 which emits white light for example may be formed in advance so as to be shared by all the pixels, and the wavelength of light to be extracted from each pixel using a color filter and the like may be selected.

The counter electrode layer 150 is formed after the organic layer 148 is formed (S204). The counter electrode layer 150 is formed by a conductive layer having translucency using a sputtering method. In the present embodiment, since the light emitting element 122 is a top-emission type which emits light from the counter electrode layer 150 side, it is preferred that the film thickness of the counter electrode layer 150 is uniform. In the present embodiment, a method which does not use a shadow mask when forming a conductive film by a sputtering method is adopted in order to increase film thickness uniformity of the counter electrode layer 150.

In a sputtering device, a shadow mask made from metal is adhered by a magnet buried in a substrate holder. In this case, when plasma density in the vicinity of the substrate changes due to magnetic field leakage from the magnetic for adhering, the film thickness of a cover film to be deposited on the substrate varies and becomes dependent on the arrangement position of the magnet for adhering. That is, uniformity of a cover film formed by sputtering drops.

In order to solve such a problem, uniformity of the film thickness of the counter electrode layer 150 is increased in the present embodiment by film formation without using a shadow mask as described above. Furthermore, a metal film such as aluminum (Al) or gold (Au) which has a film thickness to the extent that visible light passes through, or a conductive metal oxide cover film such as ITO or IZO is used as the counter electrode layer 150. In this case, a thin film such as Li—Al, Mg—Ag, Mg—Al may be arranged between organic layers 148 in order to increase carrier injection properties.

An electrical connection with the wiring 168b is formed in the contact part 170 by arranging the counter electrode layer 150 from the pixel part 104 to the contact part 170 arranged in the drive circuit part 106.

The passivation layer 152 is formed after formation of the counter electrode layer 150 (S205). The passivation layer 152 has a function to prevent the infiltration of water to the light emitting element 122 from the exterior. It is preferred that the passivation layer 152 is formed using a film with high barrier properties to water vapor. For example, it is preferred that the passivation layer 152 is formed using an inorganic insulation material such as silicon nitride, silicon oxide, silicon nitride oxide or silicon oxide nitride. In addition, the passivation layer 152 may also be formed by combining a layer of the inorganic insulation materials described above with an organic insulation material including acrylic resin, polysiloxane, polyimide and polyester and the like. For example, the passivation layer 152 may have a three layer structure in which a layer of the inorganic insulation materials described above is arranged on a lower layer side and upper layer side of an organic insulation layer using the organic insulation materials described above. In this way, by arranging a plurality of inorganic insulation layers having water vapor barrier properties interposed by an organic insulation layer, it is possible for other inorganic insulation layers to compensate for defects such as pinholes formed in a part of an inorganic insulation layer and thereby increase water vapor barrier properties.

The passivation layer 152 is formed using a sputtering method or plasma CVD method in the case of an inorganic insulation layer. In addition, it is possible to use a coating method and a vapor deposition polymerization method and the like in the case of an organic insulation layer. This type of passivation layer 152 is formed on roughly the entire surface of the first substrate 102 without using a shadow mask and the like.

Here, it is possible to further increase barrier properties to water vapor by further forming the passivation layer 152 in a region in which the first insulation layer 136 and third insulation layer 142 contact at a bottom surface in the opening part 164 of the second insulation layer 140. In addition, by arranging the passivation layer 152 to cover the contact part 170, it is possible to increase reliability of an electrical connection state between the counter electrode layer 150 and wiring 168b.

Figure 9:
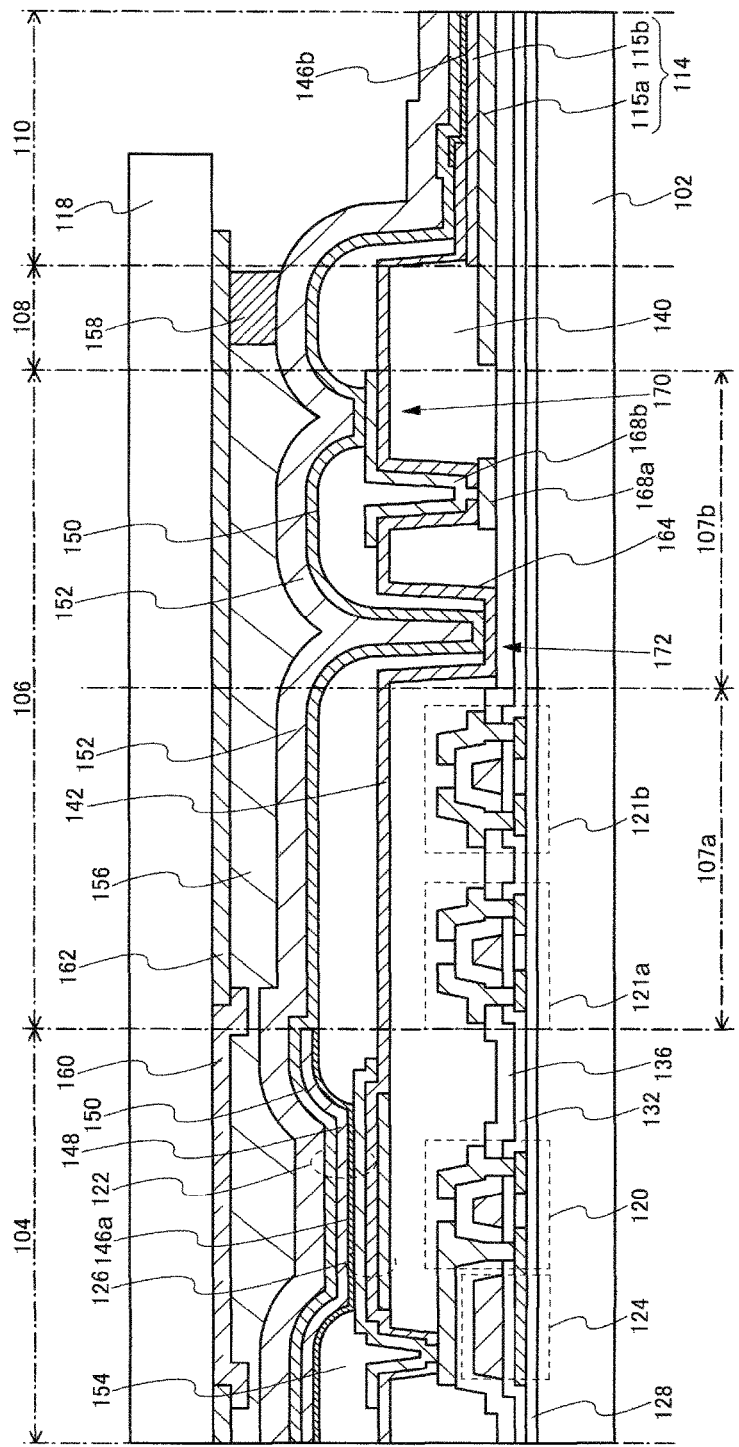
FIG. 9 is a cross-sectional diagram for explaining a manufacturing process of a display device related to one embodiment of the present invention.

Following this, the sealing member 118 is arranged in the first substrate 102 from above the passivation layer 152 as is shown in FIG. 9 (S206). In the case where the sealing member 118 is a glass or plastic plate shaped component having translucency, the sealing member 118 is attached to the first substrate using the sealing material 158. A color filter layer 160 or light blocking layer 162 may also be arranged matching the arrangement of a pixel in the sealing member 118. The light blocking layer 162 is preferred to be formed using a metal with comparatively low reflectance such as chrome or molybdenum, or a material in which black or an equivalent colorant is contained in a resin material. In this way, a function is provided for blocking scattered light or external reflected light other than the light emitted from the light emitting element 122. The color filter layer 160 is different for each adjacent pixel and can be formed so as to extract red, green and blue emitted light for example. A counter substrate may be arranged between the light blocking layer 162 and color filter layer 160 via a base film, and an overcoat layer may be further arranged so as to cover the light blocking layer 162 and color filter layer 160.

Furthermore, the sealing member 118 is arranged to cover the pixel part 104 and at least one part of the drive circuit part 106 above the first substrate 102, and on the other hand may also be arranged so as to not overlap the terminal part 110. In addition, the first substrate 102 and sealing member 118 may be arranged with a gap therebetween. A filler 156 may be arranged in the gap part between the first substrate 102 and sealing member 118. In addition, an inactive gas may also be filled into the gap part. It is preferred that high transparency to visible light is provided in the case where a filler is used. A gap may be adjusted so that a spacer is interposed when the sealing member 118 is fixed to the first substrate 102.

When the display panel is multifaced by the mother glass substrate (large area glass substrate), a separation process into individual display panels is performed at this stage (S207). In this way, a structure is formed in the first substrate 102 in which at least an end part of the terminal part 110 is exposed. In addition, even in the case where a display panel is manufactured not on a mother glass substrate but on individual substrates, a process for separating an end part of the terminal part 110 and exposing an end surface is performed.

Finally, a process for exposing the terminal electrode 114 in the terminal part 110 is performed (S208). In the processes hereto, at least the counter electrode layer 150 and passivation layer 152 are formed above the terminal electrode 114. Therefore, a process for removing these layers and exposing the terminal electrode 114 is necessary the same as a conventional process.

This process is performed by a pure water treatment in the present embodiment. That is, the terminal electrode 114 is exposed by a wet process using pure water without performing wet etching using a chemical liquid having acidity or alkalinity, or a dry etching process performed by introducing an etching gas to a vacuum device.

Figure 10A:
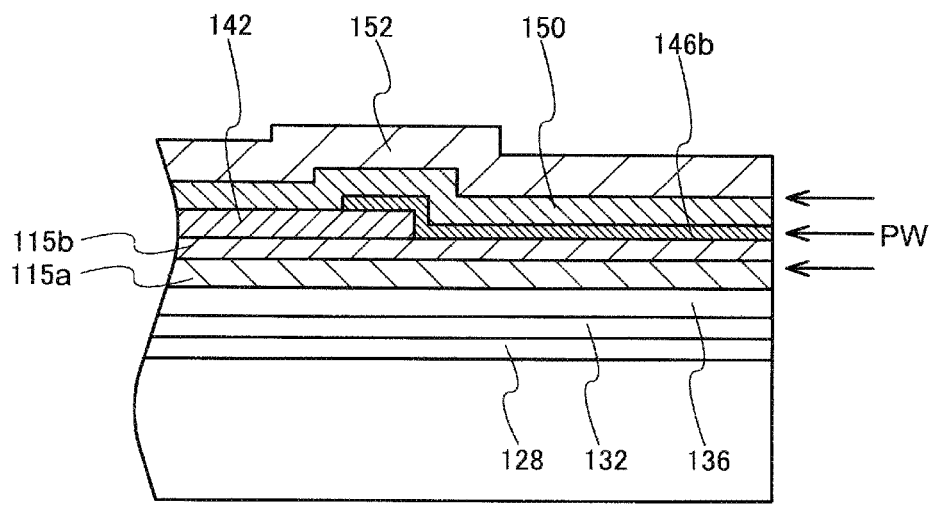
FIG. 10A is a cross-sectional diagram for explaining a manufacturing process of a display device related to one embodiment of the present invention and is a diagram for explaining a stage of performing a pure water treatment in a terminal part.

FIG. 10A shows a partial expanded view of the terminal part 110. In the terminal part 110, the terminal electrode 114 (structure including the first terminal layer 115a and second terminal layer 115b) is formed above the base insulation layer 128, gate insulation layer 132 and first insulation layer 136 for example, and the counter electrode layer 150 and passivation layer 152 are formed covering the terminal electrode 114. In addition, the intermediate layer 146 is arranged between the second terminal layer 115b of the terminal electrode 114 and the counter electrode layer 150.

Here, a wet treatment using pure water is performed. In this way, pure water infiltrates to the intermediate layer 146b which is exposed at the end surface of the terminal part 110 and peeling occurs. Peeling of the intermediate layer 146b occurs from the boundary with the second terminal layer 115b. In this way, the counter electrode layer 150 and passivation layer 152 which exist on a layer above the intermediate layer 146b are removed at the same time in a region in which the intermediate layer 146b is present. In this way, the terminal electrode 114 becomes exposed. Furthermore, in the case where the formation end of the organic layer 148 is designed to extend as far as the terminal part 110, this part of the organic layer is similarly removed.

Although this process is the same as a lithography process, since the intermediate layer 146 has immersion properties (quality allowing water to soak through) in the present embodiment, a decrease in the adhesion strength of at least the intermediate layer 146 is utilized. Specifically, the intermediate layer 146 is formed using amorphous carbon in the present embodiment. In this case, it is preferred that an amorphous carbon layer is formed into a low density film so that water can infiltrate.

Figure 10B:
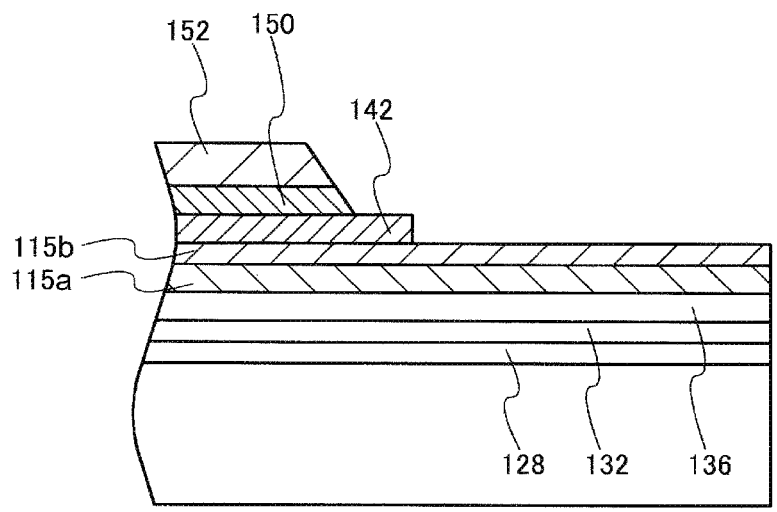
FIG. 10B is a cross-sectional diagram for explaining a manufacturing process of a display device related to one embodiment of the present invention and is a diagram showing a state of terminal part after a pure water treatment.

FIG. 10B shows the form of a terminal part after a pure water treatment. In the terminal part 110, it is preferred that the intermediate layer 146b not only on an upper surface of the terminal electrode 114 (upper surface of the second terminal layer 115b) but also overlapping the third insulation layer 142 extending to a part of the terminal part 110. That is, the third insulation layer 142 is arranged so that an end part is positioned in a region to the inner side from an outer end part of the terminal electrode 114 (in other words, outer end part of the second terminal layer 115b), and the intermediate layer 142 is arranged to overlap with the second terminal layer 115b and a part of the third insulation layer 142. In this way, it is possible to arrange an end part of the counter electrode layer 150 and the passivation layer 152 above the third insulation layer 142 as is shown in FIG. 10B. As a result, it is possible to securely prevent short circuits between the counter electrode layer 150 and terminal electrode 114. In addition, by lifting off the counter electrode layer 150 and passivation layer 152 by using the intermediate layer 146b as a layer with immersion properties, it is possible to form the end part of the counter electrode layer 150 and passivation layer 152 into a taper shape. In this way, it is possible to increase adhesion with an anisotropic conductive layer arranged above the terminal electrode 114.

Furthermore, since the intermediate layer 146a arranged in the pixel part 104 is sealed by the passivation layer 152 and also sealed by the sealing member 118, it is not affected in any way by a pure water treatment. Therefore, it is possible to process the terminal part 110 without affecting in anyway the light emitting properties of the light emitting element 122. In the present embodiment, it is possible to form one or both of the intermediate layer 146a in the pixel part 104 and intermediate layer 146b in the terminal part 110 using a layer with immersion properties (amorphous carbon for example), and it is possible to reduce the adhesive strength of the intermediate layer 146b in the terminal part 110 by wet processing.

Furthermore, in the process for exposing the terminal electrode 114, a part of the residue of the intermediate layer 146b may be left above the terminal electrode 114 or above the third insulation layer 142, or at an end surface of the counter electrode layer 150. Since the thickness of the intermediate layer 146 is 1 nm to 10 nm, for example 3 nm, even if a fine amount of carbon remains, conductivity with an anisotropic conductive film is never affected. That is, since it is not necessary to completely remove the intermediate layer 146b, it is possible to provide the conditions for exposing the terminal electrode 114 with a degree of freedom and increase processing simplicity (margin).

As described above, it is possible to manufacture the display device 100 with the structure explained in FIG. 2.

According to one embodiment of the present invention, it is possible to arrange the same layer (intermediate layer 146b in the present embodiment) as a part of a layer (intermediate layer 146a in the present embodiment) which forms the pixel part 104 or drive circuit part 106, in the terminal part 110, and using this layer to remove a layer formed above the terminal electrode 114 by lithography, it is possible to simplify the process for exposing the terminal electrode 114. In addition, in this case, since it is not necessary to arrange a special layer only in the terminal part 110, processing is simplified and manufacturing costs do not increase.

Furthermore, although an example is exemplified in the present embodiment in which amorphous carbon is used as the intermediate layer 146 arranged in the terminal part 110, the present invention is not limited to this example. For example, it is possible to replace amorphous carbon with another material if it is a cover film with immersion properties to water. For example, it is possible to use a low density zinc oxide film manufactured by a sputtering method, or a low density amorphous silicon film manufactured by a plasma CVD method.

In addition, although the present embodiment exemplified a display device arranged with a light emitting element in a pixel, the present invention is not limited to this structure, and the present embodiment can also be applied to a liquid crystal display device for example.

What is claimed is:

1. A manufacturing method of a display device, the method comprising:
   forming a terminal electrode in a terminal part of a first substrate;
   forming a pixel electrode corresponding to each pixel in a pixel part of the first substrate;
   forming a first intermediate layer in a region including the terminal electrode of the terminal part;
   forming an organic layer above the pixel electrode in the pixel part;
   forming a counter electrode layer above the first substrate including the pixel part and the terminal part;
   forming a passivation layer above the counter electrode layer;
   arranging a second substrate opposing the pixel part and bonding the first substrate and the second substrate using a sealing member enclosing the pixel part; and
   removing the first intermediate layer, the counter electrode layer and the passivation layer in the terminal part,
   wherein the first intermediate layer is formed using amorphous carbon.

2. The manufacturing method of a display device according to claim 1, the method further comprising:
   forming a second intermediate layer between the pixel electrode and the organic layer,
   wherein the second intermediate layer is arranged separate from the first intermediate layer.

3. The manufacturing method of a display device according to claim 1, wherein the first intermediate layer, the counter electrode layer and the passivation layer in the terminal part are removed after an end surface of the terminal part is exposed.

4. The manufacturing method of a display device according to claim 2, wherein the second intermediate layer is formed using amorphous carbon.

5. The manufacturing method of a display device according to claim 1, wherein the first intermediate layer, the counter electrode layer and the passivation layer are removed by a pure water process.

6. The manufacturing method of a display device according to claim 1, wherein the terminal part is formed by stacking a metal layer and a conductive metal oxide layer, and the first intermediate layer is formed above the conductive metal oxide layer.

7. The manufacturing method of a display device according to claim 5, wherein the counter electrode layer and the passivation layer are peeled away from a boundary between the conductive metal oxide layer and the first intermediate layer.

8. The manufacturing method of a display device according to claim 5, wherein an insulation layer is formed having an end part located in a region on an inner side from an external end part of the conductive metal oxide layer in the terminal part, and the first intermediate layer is formed on an upper surface of the conductive metal oxide layer and the insulation layer.

9. The manufacturing method of a display device according to claim 8, wherein an end part of the counter electrode layer and an end part of the passivation layer are formed located over the insulation layer.

* * * * *